(12) United States Patent
Wang et al.

(10) Patent No.: US 7,564,123 B1
(45) Date of Patent: Jul. 21, 2009

(54) SEMICONDUCTOR PACKAGE WITH FASTENED LEADS

(75) Inventors: Chin-Fa Wang, Hsinchu (TW); Chin-Ti Chen, Hsinchu (TW); Bing-Shun Yu, Hsinchu (TW); Wan-Jung Hsieh, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 0 days.

(21) Appl. No.: 12/122,937

(22) Filed: May 19, 2008

(51) Int. Cl.
*H01L 23/495* (2006.01)
(52) U.S. Cl. ............... 257/666; 257/675; 257/704; 257/706
(58) Field of Classification Search ........... 257/666, 257/675, 704, 706
See application file for complete search history.

(56) References Cited

U.S. PATENT DOCUMENTS 7,482,679 B2 * 1/2009 Aripin et al. ............. 257/666
2003/0001246 A1 * 1/2003 Tandy .................... 257/669

* cited by examiner

*Primary Examiner*—Thien F Tran
(74) *Attorney, Agent, or Firm*—Muncy, Geissler, Olds & Lowe, PLLC

(57) ABSTRACT

A semiconductor package primarily comprises a plurality of leadframe's leads, a chip, a paddle, an adhesive and an encapsulant encapsulating the components mentioned above. The paddle has a carrying surface and an exposed external surface. The first chip is attached to one surface of the leads. The paddle is attached to an opposing surface of the leads by the adhesive bonding the carrying surface to the leads. Furthermore, the adhesive further encapsulates the gaps between the leads without contaminating the exposed external surface and with the exposed external surface exposed from the encapsulant. Therefore, the leads obtain a better support so that the encapsulated portions of the leads will not shift nor expose from the encapsulant during molding processes without encapsulated bubbles between the leads and the paddle. The heat dissipation is also enhanced.

20 Claims, 6 Drawing Sheets

SEMICONDUCTOR PACKAGE WITH FASTENED LEADS

FIELD OF THE INVENTION

The present invention relates to semiconductor devices, especially to multi-chip semiconductor packages having paddles on leadframe's leads.

BACKGROUND OF THE INVENTION

In the conventional semiconductor packages, a plurality of leads of leadframes have been widely implemented as chip carriers and as electrical media such as Thin Small Outline Package (TSOP), Lead-On-Chip (LOC) package, Chip-On-Lead package (COL) where chips are disposed on the leads of leadframes, then the chips and the leads of leadframes are encapsulated by an encapsulant. The leads of leadframes can replace die pads for die attachment. However, just using the leads of leadframes is not enough to support the chip leading to chip or lead shifting issues during molding.

Since the leads of leadframes are not strong enough to hold the chips during molding processes, the leads of leadframes are easy to shake or shift due to mold flow causing bonding wires, internal portions of leads, or chips exposed from the encapsulant leading to poor packaging yields. In order to reduce the undesired exposure of encapsulated components exposed from the encapsulant, the vertical distances from the leads of leadframes to top or bottom of encapsulant are increased leading to the increase of package thickness which can not be implemented for multi-chip stacking. Furthermore, as the frequencies or the powers of chips keep increasing, more heat is generated during operations. As the distances from the leads of leadframes to the encapsulant are increased, the corresponding heat resistivity will also increase which means heat generated by the chip can not easily dissipate outside the chip leading to chip failure.

SUMMARY OF THE INVENTION

The main purpose of the present invention is to provide a semiconductor package to offer stronger leads of leadframes without shifting nor exposing of internal leads during molding and without encapsulated bubbles between the leads of leadframes and the paddles and to offer better heat dissipation and more packaging space for multi-chip stacking.

The second purpose of the present invention is to provide a semiconductor package to avoid the penetration of moisture.

The third purpose of the present invention is to provide a semiconductor package to control the adhesive to encapsulate the sidewalls of the leads of leadframes without encapsulating the external exposed surfaces of the paddle to ensure good encapsulation of the adhesive.

The fourth purpose of the present invention is to provide a semiconductor package to enhance the adhesion between the encapsulant and the paddle.

The fifth purpose of the present invention is to provide a semiconductor package to stock more chips with effective electrical connections to leads of leadframes within limited package dimensions.

According to the present invention, a semiconductor package primarily comprises a plurality of leadframe's leads, a first chip, a rigid paddle, an adhesive, and an encapsulant. Each lead has a first surface, a corresponding second surface, and a plurality of sidewalls between the first surface and the second surface. The first chip is attached to the first surfaces of the leads. The paddle has a carrying surface and an exposed external surface. The adhesive bonds the carrying surface of the paddle to the second surfaces of the leads to secure the leads with the paddle. Furthermore, the adhesive further encapsulates the sidewalls of the leads. The encapsulant encapsulates the first chip, the adhesive, parts of the leads, and parts of the paddle with the exposed external surface of the paddle exposed from the encapsulant.

DETAIL DESCRIPTION OF THE INVENTION

Please refer to the attached drawings, the present invention will be described by means of embodiments below.

Figure 1:
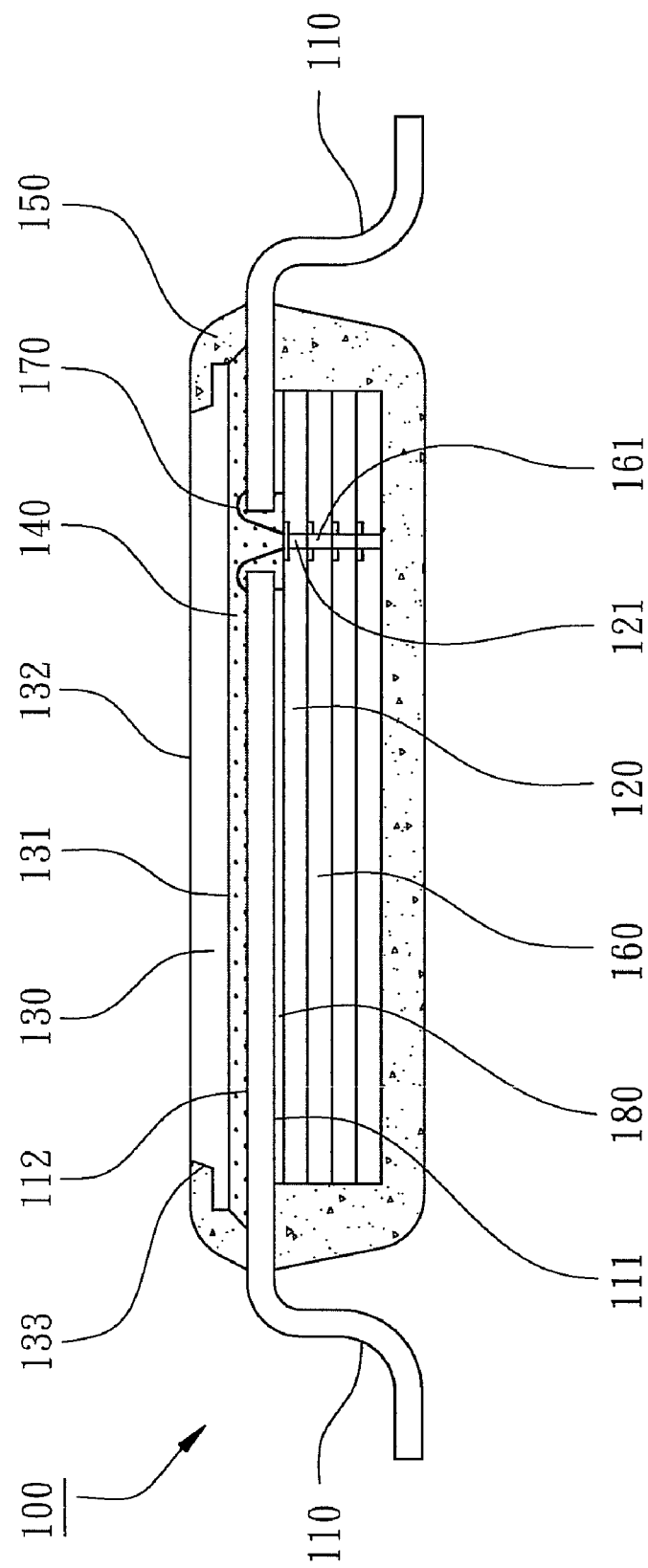
FIG. 1 shows a cross-sectional view of a semiconductor package according to the first embodiment of the present invention.
Figure 2:
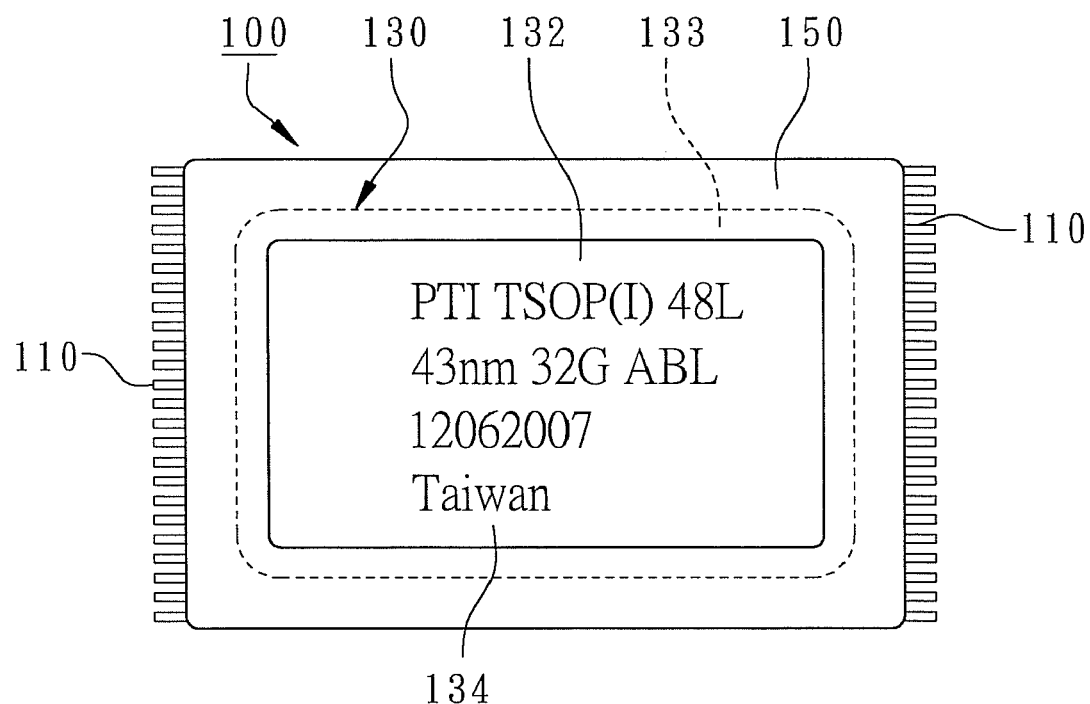
FIG. 2 shows a top view of a semiconductor package according to the first embodiment of the present invention.
Figure 3:
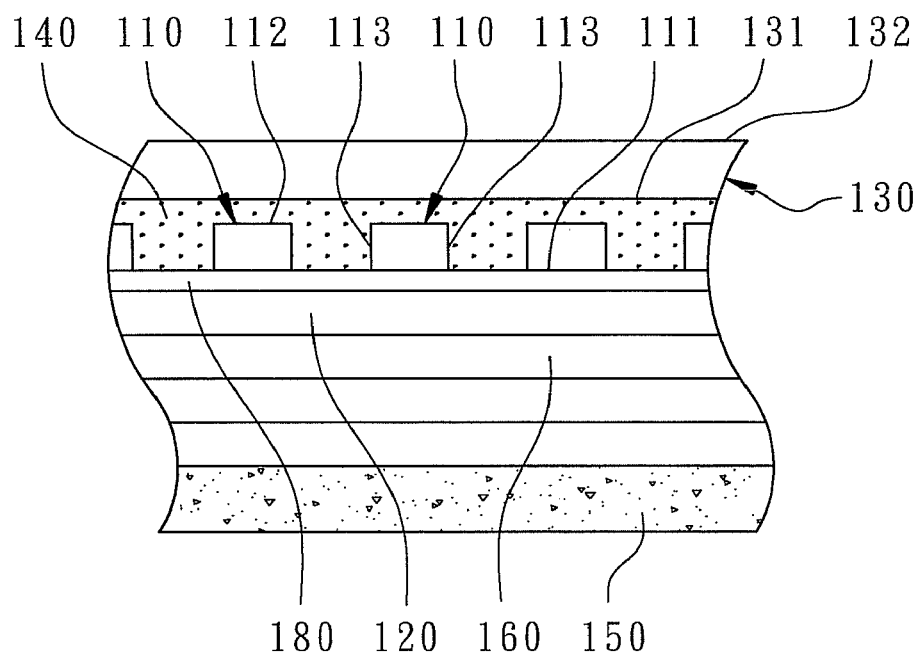
FIG. 3 shows a partial cross-sectional view of a semiconductor package along a plurality of leads according to the first embodiment of the present invention.

According to the first embodiment of the present invention, as shown in FIG. 1 and FIG. 2, a semiconductor package 100 primarily comprises a plurality of leadframe's leads 110, a first chip 120, a rigid paddle 130, an adhesive 140, and an encapsulant 150, where the paddle 130 is configured to support the leads 110 to keep the spacing between the leads 110 by the adhesive 140. The paddle 130 has an exposed external surface 132 exposed from the encapsulant 150. As shown in FIG. 1 and FIG. 3, each lead 110 has a first surface 111, a corresponding second surface 112, and a plurality of sidewalls 113 between the first surface 111 and the second surface 112, as shown in FIG. 3, where the sidewalls 113 face to each other to form gaps between leads 110. The leads 110 have a plurality of external portions extended from the sides of the encapsulant 150 and are trimmed and formed into gull-wing or other shapes of external leads so that the semiconductor package 100 can be mounted to an external printed circuit board, not shown in the figure, by SMT technologies. In this embodiment, the external portions of the leads 110 are bent away from the exposed external surface 132 so that a marking 134 on the exposed external surface 132 is visible after SMT, as shown in FIG. 2.

As shown in FIG. 1 and FIG. 3, the first chip 120 is attached to the first surfaces 111 of the leads 110 by a die-attaching material 180 such as PI tape. The internal bonding fingers of the leads 110 are disposed on an active surface of the first chip 120 and located between the first chip 120 and the paddle 130 to be firmly secured by the adhesive 140. The semiconductor package 100 further comprises a plurality of first bonding wires 170 which electrically connect the first chip 120 to the leads 110 where one ends of the first bonding wires 170 are bonded to the bonding pads of the first chip 120 and the other ends of the first bonding wires 170 are bonded to the inner bonding fingers on the second surfaces 112 of the leads 110.

In the present embodiment, the first bonding wires 170 are located between the first chip 120 and the paddle 130. The adhesive 140 completely encapsulates the first bonding wires 170 to avoid wire sweeping during molding. Furthermore, the first chip 120 has a plurality of through-silicon-vias 121 (TSV) electrically connected to the leads 110 by the first bonding wires 170 for electrically connecting one or more stacked chip(s) 160.

As shown in FIG. 1 and FIG. 3, the paddle 130 further has a carrying surface 131 opposing to the exposed external surface 132. The paddle 130 is chosen from metals, ceramics, or dummy chips. The paddle 130 is as rigid as or more rigid than the leads 110. Preferably, the paddle 130 is a metal heatsink having a good heat dissipation property. As shown in FIG. 1 and FIG. 3, the carrying surface 131 of the paddle 130 is larger than the attached active surface of the first chip 120 but slightly smaller than the one of the top surface of the encapsulant 150 to provide better supports to the leads 110. The carrying surface 131 is an internal surface for the disposition of leads 110 and the exposed external surface 132 is correspondingly away from the leads 110 and is exposed from the encapsulant 150. In the present embodiment, an indentation 133 is formed on the peripheries of the exposed external surface 132 of the paddle 130 to make the dimension of the exposed external surface 132 smaller than the one of the carrying surface 131 and to stop bleeding of the adhesive 140. As shown in FIG. 2 again, the marking 134 is formed on the exposed external surface 132 to describe the product specifications, manufacturing dates, or manufacturing locations of the semiconductor package 100. The marking 134 can be formed by either laser or by printing.

As shown in FIG. 1, the adhesive 140 bonds the carrying surface 131 of the paddle 130 to the second surfaces 112 of the leads 110 to secure the leads 110 with the paddle 130. As shown in FIG. 3, the adhesive 140 is further formed in the gaps between the sidewalls 113 of the leads 110 to increase the adhesion area of the leads 110 so that the adhesion between the leads 110 and the paddle 130 is enhanced. The adhesive 140 can be chosen from liquid or paste adhesives such as a liquid epoxy or a B-stage paste to increase the encapsulation of the sidewalls 113 of the leads 110. The adhesive 140 includes isolation resin with stress buffering functions. After the first chip 120 is attached and electrically connected to the leads 110, the adhesive 140 can be applied on the second surface 112 of the leads 110 by screen printing, stencil printing or dispensing so that the adhesive 140 can be filled into the gaps between the leads 110, as shown in FIG. 3. Alternatively, the adhesive 140 can be pre-formed on the carrying surface 131 of the paddle 130. Therefore, during the formation of the encapsulant 150, the gaps between the paddle 130 and the leads 110 and between the sidewalls 113 are filled with the adhesive 140 so that the encapsulant 150 does not need to fill into the gaps, therefore, the issue of encapsulated bubbles is eliminated. Preferably, as shown in FIG. 3 again, the adhesive 140 has a contact interface with the die-attaching material 180 at the gaps between the sidewalls 113 of the leads 110 to enhance the bonding strengths of the encapsulation of the leads 110. Since the dimension of the exposed external surface 132 of the paddle 130 is smaller than the one of the carrying surface 131 and the indentation 133 is formed at the peripheries of the exposed external surface 132, the adhesive 140 can be controlled to encapsulate the sidewalls 113 of the leads 110 without encapsulating the exposed external surface 132.

As shown in FIG. 1, the encapsulant 150 encapsulates the first chip 120, the adhesive 140, parts of the leads 110, and parts of the paddle 130 so that the exposed external surface 132 of the paddle 130 is exposed from the encapsulant 150 where the encapsulated parts of the leads 110 are inner leads and the encapsulated parts of the paddle 130 comprises the peripheries of the carrying surface 131. Preferably, the encapsulant 150 has a top surface coplanar to the exposed external surface 132 of the paddle 130 in a manner to completely encapsulate the adhesive 140. The encapsulant 150 prevents the penetration of moisture to avoid delamination. The encapsulant 150 fully fills the indentation 133 to ensure the complete encapsulation of the adhesive 140 and to increase the adhesions of the paddle 130 to the encapsulant 150. Commonly, the encapsulant 150 is an epoxy molding compound (EMC) formed by transfer molding.

Therefore, the leads 110 obtain good supports so that the inner leads of the leads 110 will not shift nor expose from the encapsulant 150. The leads 110 and the first chip 120 are firmly held on the paddle 130 during molding processes, therefore, the leads 110 and the first chip 120 will not shake nor shift due to mold flow. No encapsulated bubble is formed between the leads 110 and the paddle 130 due to the adhesive 140. Furthermore, since the exposed external surface 132 of the paddle 130 is exposed from the encapsulant 150, therefore, the heat generated by the first chip 120 during operation can be dissipated through the paddle 130 to the environment to provide better heat dissipation and to stock more chips.

In order to increase more functions or more memory capacities, one or more chips can be stacked with the first chip 120. As shown in FIG. 1, the semiconductor package 100 further comprises a plurality of second chips 160 stacked with the first chip 120 correspondingly away from the leads 110. One of the second chips 160 is attached to the opposing surface of the first chip 120 away from the leads 110. Each second chip 160 may have a plurality of second TSV 161 to electrically connect to each other. In one embodiment, the second TSV 161 and the corresponding first TSV 121 are vertically aligned and connected to electrically connect the second chips 160 to the first chip 120.

Figure 4:
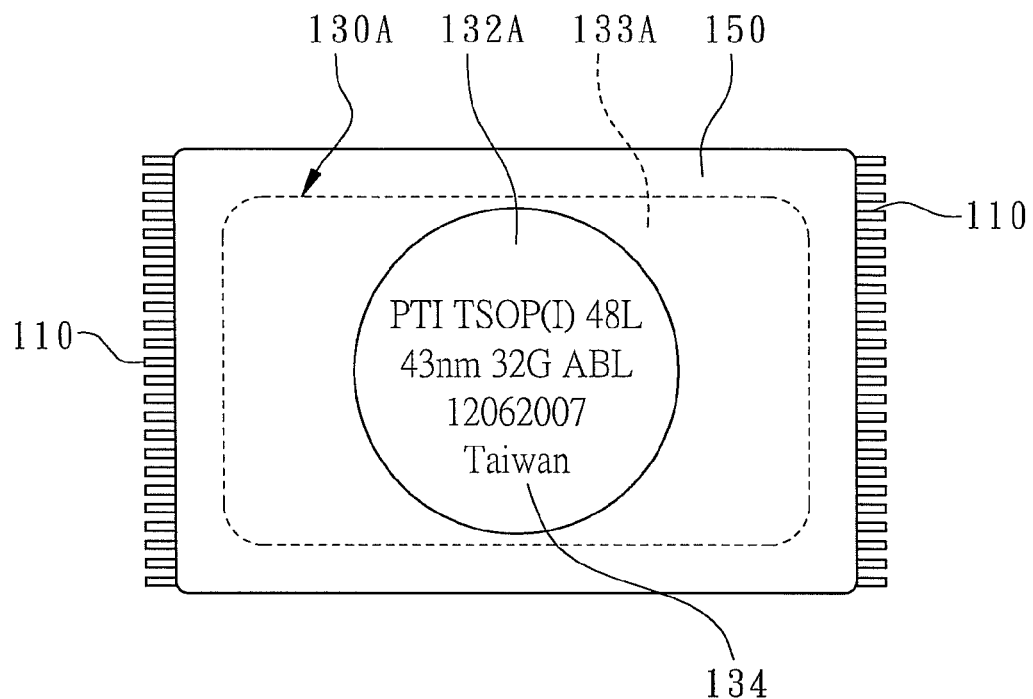
FIG. 4 to FIG. 7 show the top views of semiconductor packages with different shapes of exposed external surfaces of a paddle according to the first embodiment of the present invention.
Figure 5:
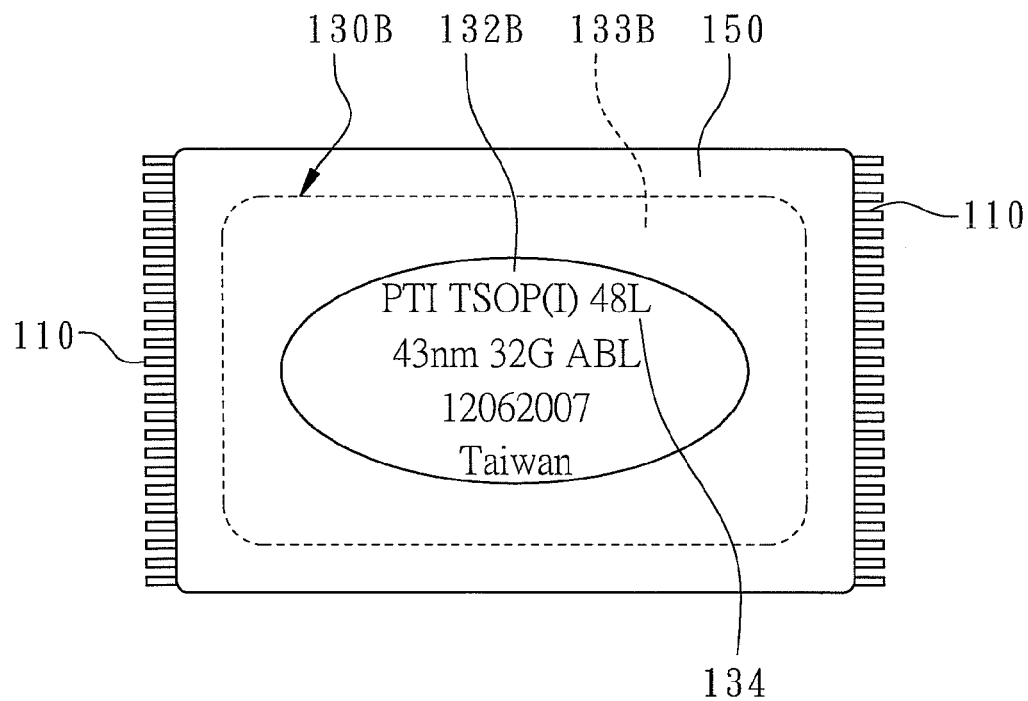
Figure 6:
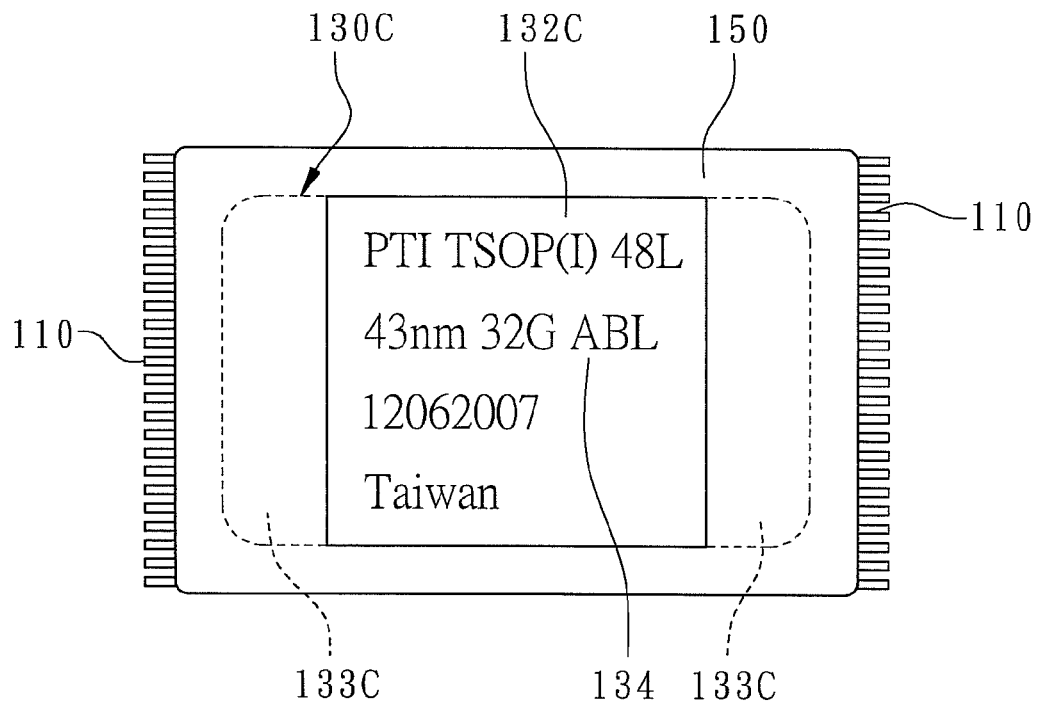
Figure 7:
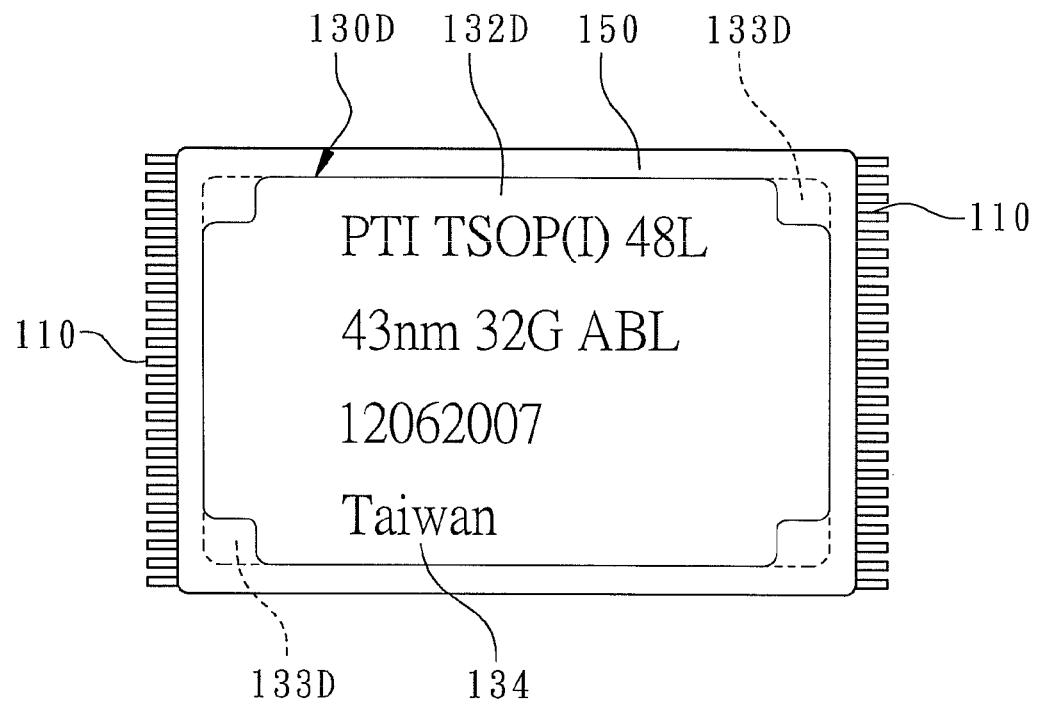

The carrying surface 131 is proportional to the top surface of the encapsulant 150 in order to enhance the supports of the leads 110 and to easily align the paddle 130, for example, the carrying surface 131 is a rectangle. However, the exposed external surface 132 of the paddle 130 is not limited and can be various shapes. In one embodiment, as shown in FIG. 2, the exposed external surface 132 of the paddle 130 also is a rectangle and the shape of the indentation 133 has a shape like a continuous rectangular ring encapsulated by the encapsulant 150. In another embodiment, as shown in FIG. 4, another exposed external surface 132A of a paddle 130A is a circle to disperse stresses and an indentation 133A around the peripheries of the paddle 130A has a shape like a compensated ring to the exposed external surface 132A and is encapsulated by the encapsulant 150. In another embodiment, as shown in FIG. 5, another exposed external surface 132B of a paddle 130B is an ellipse to disperse stresses and the indentation 133B of the paddle 130B is a compensated ring to the exposed external surface 132B and is encapsulated by the encapsulant 150. In another embodiment, as shown in FIG. 6, another exposed external surface 132C of a paddle 130C is a square and the indentations 133C of the paddle 130C are two strips formed on two corresponding sides of the paddle 130C to be encapsulated by the encapsulant 150. In another embodiment, as shown in FIG. 7, a plurality of indentations 133D of a paddle 130D encapsulated by the encapsulant 150 have the shapes of squares and located at four corners of the paddle 130D.

Figure 8:
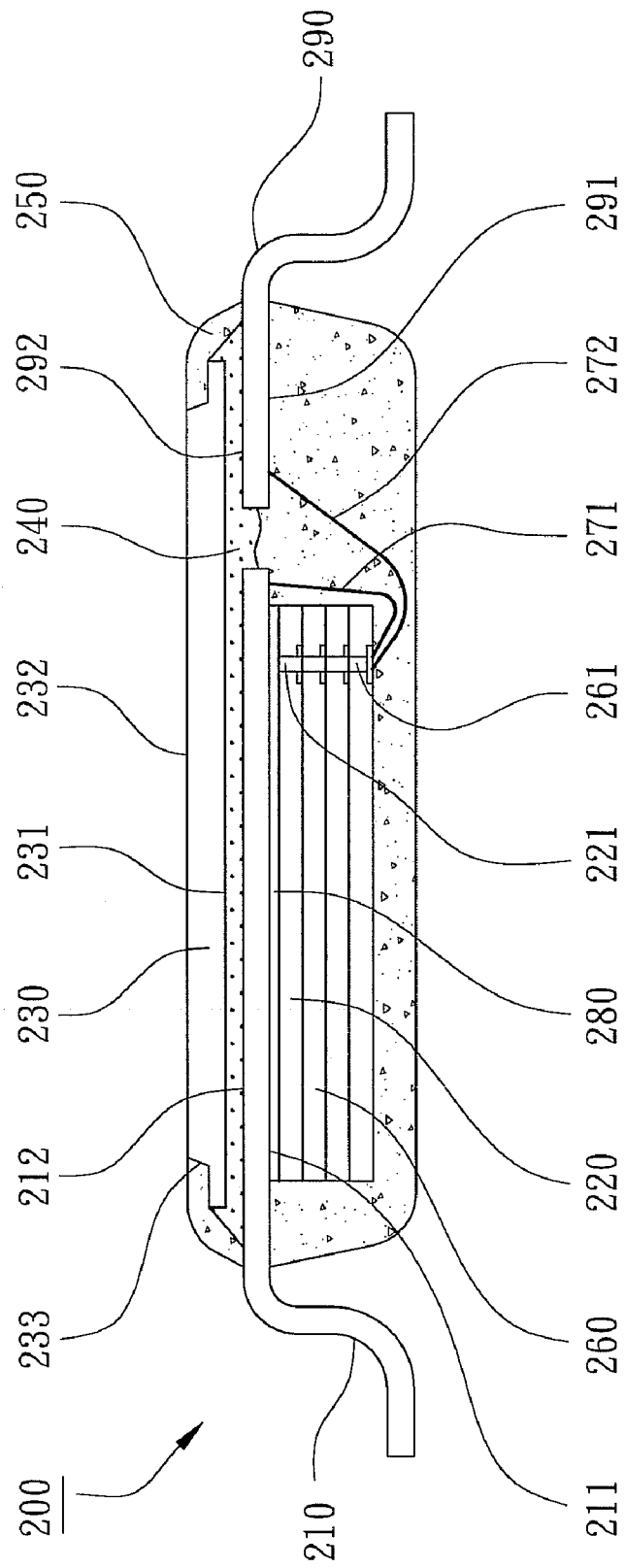
FIG. 8 shows a cross-sectional view of a semiconductor package according to the second embodiment of the present invention.
Figure 9:
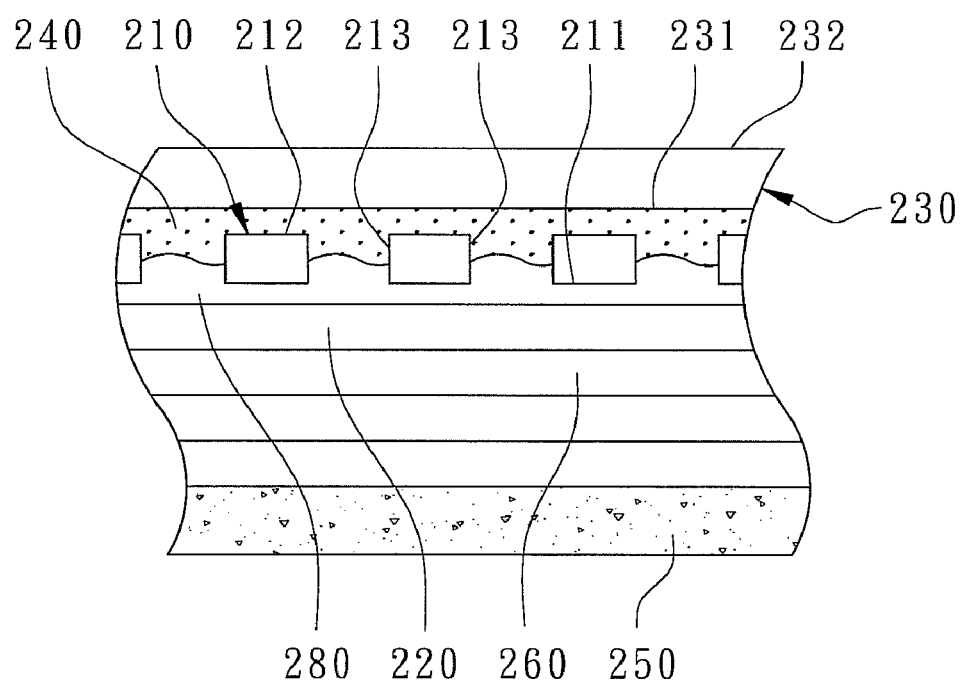
FIG. 9 shows a partial cross-sectional view of a semiconductor package along a plurality of leads according to the second embodiment of the present invention.

In the second embodiment of the present invention, another semiconductor package 200 is revealed as shown in FIG. 8, primarily comprising a plurality of first leads 210 of a leadframe, a first chip 220, a rigid paddle 230, an adhesive 240, and an encapsulant 250. The major components in the second embodiment of the present invention are almost the same as the first embodiment. As shown in FIG. 8 and FIG. 9, each first lead 210 has a first surface 211, a corresponding second surface 212, and a plurality of sidewalls 213 between the first surface 211 and the second surface 212. The first chip 220 is attached to the first surface 211 of the first leads 210 by a die-attaching material 280 where the die-attaching material 280 is a liquid epoxy or a B-stage film which can partially 2 encapsulate the sidewalls 213 of the first leads 210 to create a non-planar contact 3 interface formed between the adhesive 240 and the die-attaching material 280 at the gaps 4 between the sidewalls 213 of the leads 210, as shown in FIG. 9. Accordingly, the adhesion strengths of the encapsulation of the first leads 210 are enhanced. In the present embodiment, the semiconductor package 200 further comprises a plurality of second leads 290 which are shorter than the first leads 210 without being attached by the first chip 220. Each second lead 290 has a third surface 291 and a fourth surface 292. The second leads 290 are adhered to the paddle 230 by the adhesive 240. The paddle 230 has a carrying surface 231 and an exposed external surface 232. The first chip 220 has a plurality of first TSV's 221 (through silicon vias) electrically connecting to the first leads 210. As shown in FIG. 9, the carrying surface 231 of the paddle 230 are bonded to the second surfaces 212 of the first leads 210 by the adhesive 240 where the adhesive 240 further formed in the gaps between the sidewalls 213 of the first leads 210. In the present embodiment, the adhesive 240 further firmly adheres the fourth surface 292 of the second leads 290 to the paddle 230. Preferably, an indentation 233 is formed on the peripheries of the exposed external surface 232 of the paddle 230 to make the dimension of the exposed external surface 232 smaller than the one of the carrying surface 231 to avoid overflowing and contaminating of the adhesive 240 to the exposed external surface 232 leading to mold flash. The encapsulant 250 encapsulates the first chip 220, the adhesive 240, parts of the first leads 210, parts of the second leads 290, and parts of the paddle 230. The exposed external surface 232 of the paddle 230 exposed from the encapsulant 250 to enhance heat dissipation. In this embodiment, the encapsulant 250 has a top surface coplanar to the exposed external surface 232 of the paddle 230 in a manner to completely encapsulate the adhesive 240. The encapsulant 250 is further formed in the indentation 233 to ensure the complete encapsulation of the adhesive 240 and to avoid the delamination of the paddle 230 from the encapsulant 250.

Therefore, the assembly of the paddle 230 can provide better supports to the first chip 220 and the second chip 260 during the formation of the encapsulant 250 to avoid shifting and tilting of the first leads 210, the second leads 290, and the first chip 220 due to mold flow.

In the present embodiment, one or more second chips 260 are disposed on top of the first chip 220 correspondingly away from the first leads 210. In the present embodiment, the semiconductor package 200 further comprises a plurality of first bonding wires 271 and a plurality of second bonding wires 272 where the first bonding wires 271 electrically connect the second chips 260 to the first leads 210 and the second bonding wires 272 electrically connect the second chips 260 to the second leads 290. As shown in FIG. 8, at least one of the second chips 260 has a plurality of second TSV's 261 which are vertically aligned and connected to the TSV's 221 or 261 of adjacent chip 220 or 260 so that the stacked chips 220 and 260 are electrically interconnected. In another embodiment, some or all of the first bonding wires 271 can be replaced by the first TSV's 221.

The above description of embodiments of this invention is intended to be illustrative and not limiting. Other embodiments of this invention will be obvious to those skilled in the art in view of the above disclosure.

What is claimed is:

1. A semiconductor package primarily comprising:
   a plurality of leadframe's leads, each having a first surface, a corresponding second surface, and a plurality of sidewalls between the first surface and the second surface;
   a first chip attached to the first surface of the leads;
   a rigid paddle having a carrying surface and an exposed external surface;
   an adhesive bonding the carrying surface of the paddle to the second surfaces of the leads to secure the leads with the paddle, wherein the adhesive is further formed in the gaps between the sidewalls of the leads; and
   an encapsulant encapsulating the first chip, the adhesive, parts of the leads, and parts of the paddle, wherein the exposed external surface is exposed from the encapsulant.

2. The semiconductor package as claimed in claim 1, wherein the encapsulant has a top surface coplanar to the exposed external surface of the paddle in a manner to completely encapsulate the adhesive.

3. The semiconductor package as claimed in claim 2, wherein the carrying surface is proportional to the top surface of the encapsulant.

4. The semiconductor package as claimed in claim 1, wherein an indentation is formed on the peripheries of the exposed external surface to make the dimension of the exposed external surface smaller than the one of the carrying surface.

5. The semiconductor package as claimed in claim 4, wherein the encapsulant fully fills the indentation.

6. The semiconductor package as claimed in claim 5, wherein the indentation has a shape like a continuous ring.

7. The semiconductor package as claimed in claim 1, further comprising a plurality of first bonding wires electrically connecting the first chip to the leads.

8. The semiconductor package as claimed in claim 7, wherein the adhesive encapsulates the first bonding wires.

9. The semiconductor package as claimed in claim 8, wherein the adhesive includes isolation resin with stress buffering functions.

10. The semiconductor package as claimed in claim 1, wherein the first chip has a plurality of through silicon vias (TSV) electrically connected to the leads.

11. The semiconductor package as claimed in claim 1, further comprising at least a second chip attached to an opposing surface of the first chip away from the leads.

12. The semiconductor package as claimed in claim 11, wherein the second chip has a plurality of through silicon vias (TSV) electrically connecting to the first chip.

13. The semiconductor package as claimed in claim 11, further comprising a plurality of bonding wires electrically connecting the second chip to the leads.

14. The semiconductor package as claimed in claim 1, wherein the leads have a plurality of external portions extending from a plurality of sides of the encapsulant and bent away from the exposed external surface.

15. The semiconductor package as claimed in claim 14, further comprising a marking formed on the exposed external surface.

16. The semiconductor package as claimed in claim 1, further comprising a plurality of second leads which are shorter than the first leads without being attached by the first chip, wherein the second leads are adhered to the paddle by the adhesive.

17. The semiconductor package as claimed in claim 1, further comprising a die-attaching material formed between the leads and the first chip.

18. The semiconductor package as claimed in claim 17, wherein a contact interface is formed between the adhesive and the die-attaching material at the gaps between the sidewalls of the leads.

19. The semiconductor package as claimed in claim 18, wherein the contact interface is non-planar.

20. The semiconductor package as claimed in claim 1, wherein the carrying surface of the paddle is larger than the attached surface of the first chip.

\* \* \* \* \*